United States Patent
Kang et al.

(10) Patent No.: US 8,477,553 B2
(45) Date of Patent: Jul. 2, 2013

(54) FUSE CIRCUIT AND SEMICONDUCTOR DEVICE HAVING THE SAME

(75) Inventors: Sang-Seok Kang, Suwon-si (KR); Sang-Man Byun, Suwon-si (KR); Jae-Hoon Joo, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 217 days.

(21) Appl. No.: 13/020,450

(22) Filed: Feb. 3, 2011

(65) Prior Publication Data
US 2011/0188334 A1 Aug. 4, 2011

(30) Foreign Application Priority Data
Feb. 4, 2010 (KR) .................. 10-2010-0010517

(51) Int. Cl.
*G11C 5/14* (2006.01)
(52) U.S. Cl.
USPC .......................................... 365/226; 365/191
(58) Field of Classification Search
USPC .................................. 365/226, 191
See application file for complete search history.

(56) References Cited

U.S. PATENT DOCUMENTS

| 6,744,683 | B2 | 6/2004 | Niiro | |
|---|---|---|---|---|
| 2002/0093867 | A1* | 7/2002 | Muraoka et al. | 365/225.7 |
| 2006/0132183 | A1 | 6/2006 | Lim et al. | |
| 2008/0247256 | A1* | 10/2008 | Kim | 365/222 |
| 2009/0212853 | A1* | 8/2009 | Kim et al. | 327/539 |
| 2010/0061160 | A1* | 3/2010 | Jeong | 365/189.07 |

FOREIGN PATENT DOCUMENTS

| JP | 2004-013930 A | 1/2004 |
|---|---|---|
| JP | 2006-185582 A | 7/2006 |
| KR | 10 2005-0106580 A | 11/2005 |
| KR | 10 2006-0072226 A | 6/2006 |

* cited by examiner

*Primary Examiner* — Michael Tran
(74) *Attorney, Agent, or Firm* — Lee & Morse, P.C.

(57) ABSTRACT

Provided is a fuse circuit capable of selectively using a power supply voltage for a logic operation according to an operation mode. The fuse circuit includes a mode generating circuit, a power supply voltage selection circuit, and at least one fuse unit. The mode generating circuit generates a plurality of mode signals. The power supply voltage selection circuit selects one out of a plurality of power supply voltages in response to the plurality of mode signals and outputs the selected power supply voltage to a first node. Each of the fuse units is coupled between the first node and a ground voltage and uses the selected power supply voltage as a power supply voltage for a logic operation. Thus, a semiconductor device including the fuse circuit may accurately test a connection state of a fuse.

19 Claims, 7 Drawing Sheets

|       | INITIAL | TEST | NORMAL |
|-------|---------|------|--------|
| VCCHB | H       | L    | L      |
| TMRS  | L       | L    | H      |
| MOD1  | H       | H    | L      |
| MOD2  | L       | L    | H      |

FUSE CIRCUIT AND SEMICONDUCTOR DEVICE HAVING THE SAME

BACKGROUND

1. Field

Embodiments relate to a semiconductor device and, more particularly, to a semiconductor device having a fuse circuit.

2. Description of the Related Art

In general, fuses may be employed for various electronic circuits, such as an operation mode selection circuit configured to select a mode and a redundancy circuit. For example, fabrication of semiconductor memory devices may include cutting at least one of a plurality of fuses to select a desired operation mode or repair a redundancy circuit if required.

SUMMARY

One or more embodiments may provide a fuse circuit to which a power supply voltage is selectively applied according to an operation mode.

One or more embodiments may provide a semiconductor memory device including a fuse circuit to which a power supply voltage is selectively applied according to an operation mode.

One or more embodiments may provide a semiconductor device including a fuse circuit to which a power supply voltage is selectively applied according to an operation mode.

One or more embodiments may provide a fuse circuit including a mode generating circuit, a power supply voltage selection circuit, and at least one fuse unit. The mode generating circuit generates a plurality of mode signals. The power supply voltage selection circuit selects one of a plurality of power supply voltages in response to the plurality of mode signals and outputs the selected power supply voltage to a first node. The at least one fuse unit is coupled between the first node and a ground voltage and uses the selected power supply voltage as a power supply voltage for a logic operation and performs a fusing operation to generate a fuse output voltage.

The mode generating circuit may generate the plurality of mode signals based on a power-up signal and a test mode-register-set (TMRS) signal.

The fuse circuit may operate in a normal mode when the power-up signal is disabled and the TMRS signal is disabled, and operate in a test mode when the power-up signal is disabled and the TMRS signal is enabled.

A first power supply voltage may be output to the first node in a normal mode, and a second power supply voltage having a different voltage level from the first power supply voltage may be output to the first node in a test mode.

The mode generating circuit may include a first inverter, a NOR gate, a second inverter, a MOS transistor, and a third inverter.

The first inverter may invert the phase of a TMRS signal, and the NOR gate may perform a logic NOR on a power-up signal and an output signal of the first inverter. The second inverter may invert the phase of an output signal of the NOR gate. The MOS transistor may have a drain connected to an input terminal of the second inverter, a gate connected to an output terminal of the second inverter, and a source connected to a ground. The third inverter may invert the phase of an output signal of the second inverter.

A first mode signal may be output from the output terminal of the second inverter, and a second mode signal may be output from an output terminal of the third inverter.

The first mode signal may be enabled and the second mode signal may be disabled in a normal mode, and the first mode signal may be disabled and the second mode signal may be enabled in a test mode.

The power supply voltage selection circuit may include a first MOS transistor and a second MOS transistor.

The first MOS transistor may output a first power supply voltage to the first node in response to a first mode signal. The second MOS transistor may output a second power supply voltage having a different voltage level from the first power supply voltage to the first node in response to a second mode signal.

The first power supply voltage may be used in a normal mode, and the second power supply voltage may be used to test a connection state of a fuse included in each of the fuse units.

The power supply voltage selection circuit may include a first MOS transistor, a second MOS transistor, and a third MOS transistor. The first MOS transistor may output a first power supply voltage to the first node in response to a first mode signal. The second MOS transistor may output a second power supply voltage having a higher voltage level than the first power supply voltage to the first node in response to a second mode signal. The third MOS transistor may output a third power supply voltage having a lower voltage level than the first power supply voltage to the first node in response to a third mode signal.

The first power supply voltage maybe used in a normal mode, the second power supply voltage may be used to test a connection state of a fuse included in each of the fuse units after a cutting operation is performed on the fuse, and the third power supply voltage may be used to test the connection state of the fuse when the cutting operation is not performed on the fuse.

Each of the fuse units may include a fuse, a first PMOS transistor, a first NMOS transistor, a first inverter, a second NMOS transistor, and a second inverter.

The fuse may have a first terminal connected to the first node. The first PMOS transistor may have a gate to which a power-up signal is applied, a source connected to a second terminal of the fuse, and a drain connected to a second node. The first NMOS transistor may have a gate to which the power-up signal is applied, a drain connected to the second node, and a source connected to a ground. The first inverter may invert the phase of a voltage signal of the second node. The second NMOS transistor may have a drain connected to the second node, a gate connected to an output terminal of the first inverter, and a source connected to the ground. The second inverter may invert the phase of an output signal of the first inverter and generate a fuse output signal.

After the cutting operation is performed on the fuse, a second power supply voltage having a voltage level higher than a first power supply voltage output to the first node in the normal mode may be transmitted to the first node, and a logic state of the voltage signal of the second node may be detected to test a connection state of the fuse.

When the voltage signal of the second node is at a logic high level, a connection state of the fuse may be determined to be failed.

When the cutting operation is not performed on the fuse, a second power supply voltage having a voltage level lower than the first power supply voltage output to the first node in the normal mode may be transmitted to the first node, and the logic state of the voltage signal of the second node may be detected to test the connection state of the fuse.

When the voltage signal of the second node is at a logic low level, a connection state of the fuse may be determined to be failed.

One or more embodiments may provide a semiconductor memory device including a memory cell array, a row decoder, and a redundant row decoder. The memory cell array may have a normal memory cell array connected to word lines and column selection lines and a redundant memory cell array connected to redundant word lines and redundant column selection lines. The row decoder may decode row address signals, generate word line driving signals, and transmit the word line driving signals to the word lines. When a defect occurs in at least one of the word lines, the redundant row decoder may decode the row address signals, generate redundant word line driving signals, and transmit the redundant word line driving signals to the redundant word lines. The redundant row decoder may include a fuse circuit, which may select one of a plurality of power supply voltages according to an operation mode, use the selected power supply voltage as a power supply voltage for a logic operation, and perform a fusing operation to generate a fuse output voltage.

One or more embodiments may provide a semiconductor memory device includes a memory cell array, a column decoder, and a redundant row decoder. The memory cell array has a normal memory cell array connected to word lines and column selection lines and a redundant memory cell array connected to redundant word lines and redundant column selection lines. The column decoder decodes column address signals, generates column selection signals, and transmits the column selection signals to the column selection lines. The redundant column decoder decodes the column address signals, generates redundant column selection signals, and transmits the redundant column selection signals to the redundant column selection lines when a defect occurs in at least one of the column selection lines. The redundant column decoder includes a fuse circuit, which selects one of a plurality of power supply voltages according to an operation mode, uses the selected power supply voltage as a power supply voltage for a logic operation, and performs a fusing operation to generate a fuse output voltage.

One or more embodiments may provide a semiconductor device includes a fuse circuit and an internal circuit. The fuse circuit may select one of a plurality of power supply voltages according to an operation mode, use the selected power supply voltage as a power supply voltage for a logic operation, and perform a fusing operation to generate a fuse output voltage. The internal circuit may perform a specific operation in response to the fuse output voltage.

The specific operation may include selecting the operation mode of the semiconductor device or enabling a redundancy array when a defective cell is included in a memory cell array.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Korean Patent Application No. 10-2010-0010517, filed on Feb. 4, 2010, in the Korean Intellectual Property Office, and entitled: "Fuse Circuit and Semiconductor Device Having the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that, although the tennis first, second, etc. may be used herein to describe various elements, these elements should not be limited by these terms. These teens are only used to distinguish one element from another element. Thus, a first element discussed below could be termed a second element without departing from the teachings of the present inventive concept.

It will be understood that when an element is referred to as being "on," "under," "connected to," or "coupled to" another element, it can be directly on, under, connected or coupled to the other element or one or more intervening elements may be present. In contrast, when an element is referred to as being "directly on," "directly under," "directly connected to," or "directly coupled to" another element, there are no intervening elements present. Meanwhile, spatially relative terms, such as "between" and "directly between" or "adjacent to" and "directly adjacent to" and the like, which are used herein for ease of description to describe one element or feature's relationship to another element(s) as illustrated in the figures, should be interpreted similarly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. Like reference numerals refer to like elements throughout the specification.

Unless expressly defined in a specific order herein, respective steps described in the present inventive concept may be performed otherwise. That is, the respective steps may be performed in a specified order, substantially at the same time, or in reverse order.

Hereinafter, a fuse circuit and a semiconductor device having the same according to embodiments of the inventive concept will be described with reference to the appended drawings.

Figure 1:
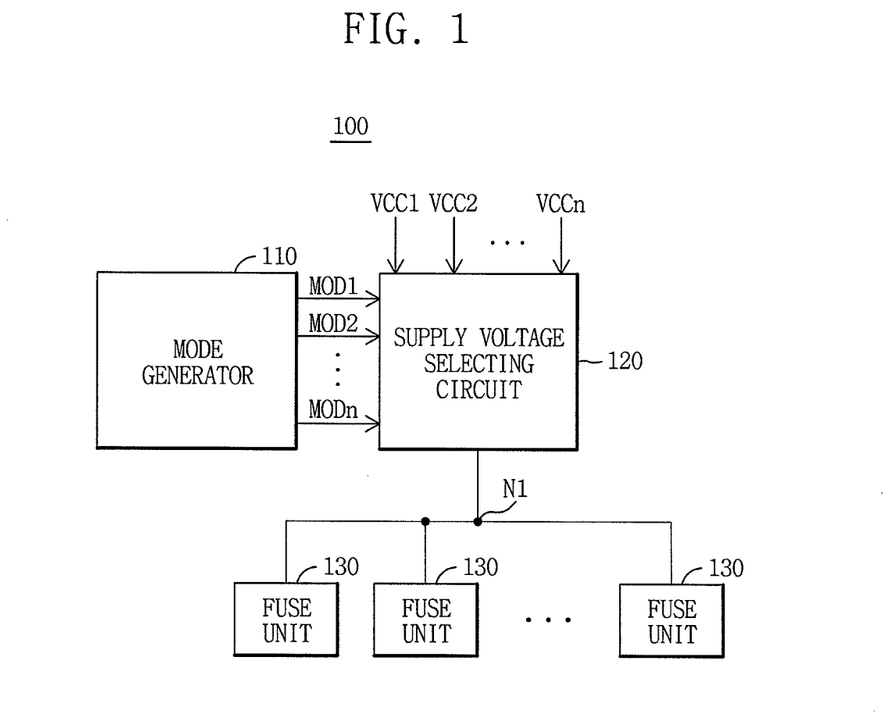
FIG. 1 illustrates a block diagram of an exemplary embodiment of a fuse circuit.

FIG. 1 illustrates a block diagram of an exemplary embodiment of a fuse circuit 100.

Referring to FIG. 1, the fuse circuit 100 may include a mode generating circuit 110, a power supply voltage selection circuit 120, and fuse units 130.

The mode generating circuit 110 may generate a plurality of mode signals, e.g., MOD1, MOD2, MODn. The power supply voltage selection circuit 120 may select one of a plurality of power supply voltages, e.g., VCC1, VCC2, VCCn, in response to the mode signals MOM, MOD2, MODn. The power supply voltage selection unit 120 may output the selected power supply voltage to a first node N1. Each of the fuse units 130 may be coupled between the first node N1 and a ground. The fuse units 130 may use the selected power supply voltage as a power supply voltage for a logic operation. The fuse units 130 may perform a fusing operation and may generate a fuse output voltage.

Figure 2:
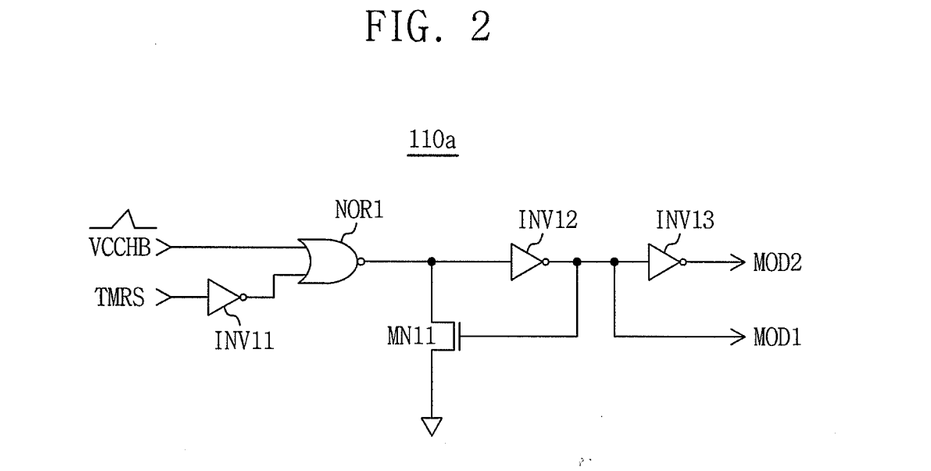
FIG. 2 illustrates a circuit diagram of an exemplary embodiment of a mode generator employable in the fuse circuit of FIG. 1.

FIG. 2 illustrates a circuit diagram of an exemplary embodiment of a mode generator 110a, which may be employed in the fuse circuit 100 of FIG. 1.

Referring to FIG. 2, the mode generator 110a may include a first inverter INV11, a NOR gate NOR1, a second inverter INV12, a first NMOS transistor MN11, and a third inverter INV13.

The first inverter INV11 may invert the phase of a test mode-register-set (TMRS) signal. The NOR gate NOR1 may perform a logic NOR on a power-up signal VCCHB and an output signal of the first inverter INV11. The second inverter INV12 may invert the phase of an output signal of the NOR gate NOR1 and output the first mode signal MOD1. The first NMOS transistor MN11 may have a drain connected to an input terminal of the second inverter INV12, a gate connected to an output terminal of the second inverter INV12, and a source connected to a ground. The third inverter INV13 may invert the phase of an output signal of the second inverter INV12 and output the second mode signal MOD2.

Figure 3:
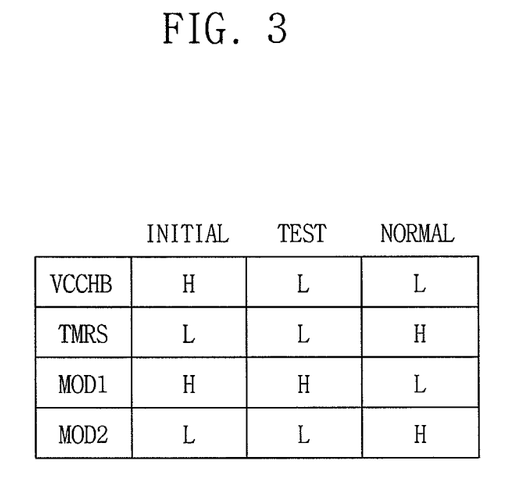
FIG. 3 illustrates a table showing an exemplary operation of the mode generator of FIG. 2.

FIG. 3 illustrates a table showing an exemplary operation of the mode generator 110a of FIG. 2.

A power-up signal VCCHB may be maintained at a logic high level for a short time after application of a power supply voltage VCC, and may be maintained at a logic low level after stabilization of the power supply voltage VCC. The TMRS signal may be enabled during a test mode. The TMRS signal may be disabled during a normal mode.

Referring to FIG. 3, during a test mode, after the power supply voltage is stabilized, e.g., after the power-up signal VCCHB is changed to the logic low level, and when the TMRS signal is at a logic low level, the first mode signal MOD1 may be disabled, and the second mode signal MOD2 may be enabled. Referring to FIG. 3, during a normal mode, after the power supply voltage is stabilized, e.g., after the power-up signal VCCHB is changed to the logic low level, and when the TMRS signal is at a logic high level, the first mode signal MOD1 may be enabled, and the second mode signal MOD2 may be disabled.

The fuse circuit 100 may operate in the normal mode when the power-up signal VCCHB is disabled and the TMRS signal is disabled. The fuse circuit 100 may operate in the test mode when the power-up signal VCCHB is disabled and the TMRS signal is enabled. That is, the fuse circuit 100 may operate in the normal mode when the first mode signal MOD1 is enabled. The fuse circuit 100 may operate in the test mode when the second mode signal MOD2 is enabled.

Figure 4:
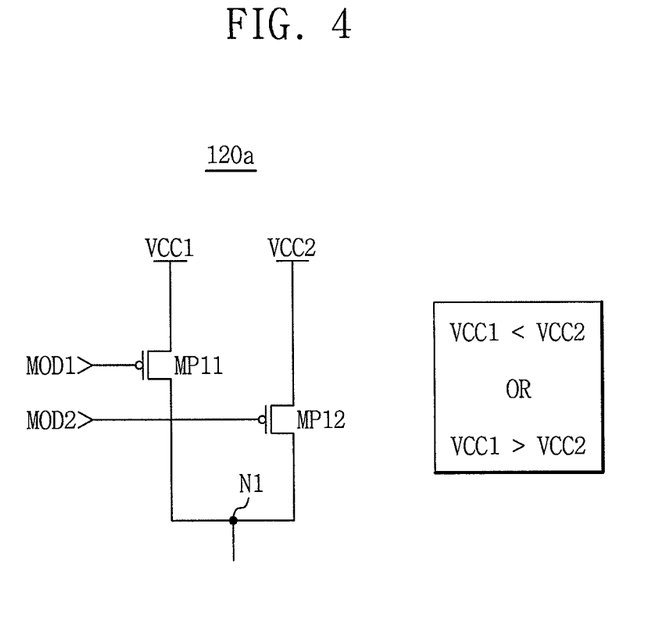
FIG. 4 illustrates a circuit diagram of an exemplary embodiment of a power supply voltage selection circuit employable in the fuse circuit of FIG. 1.

FIG. 4 illustrates a circuit diagram of an exemplary embodiment of a power supply voltage selection circuit 120a employable in the fuse circuit 100 of FIG. 1.

Referring to FIG. 4, the power supply voltage selection circuit 120a may include a first PMOS transistor MP11 and a second PMOS transistor MP12.

The first PMOS transistor MP11 may output a first power supply voltage VCC1 to a first node N1 in response to the first mode signal MOD1. The second PMOS transistor MP12 may output a second power supply voltage VCC2 having a different voltage level from the first power supply voltage VCC1 to the first node N1 in response to the second mode signal MOD2. More particularly, the second power supply voltage VCC2 may be controlled to have a higher voltage level than the first power supply voltage VCC1 and a lower voltage level than the first power supply voltage VCC1.

The first power supply voltage VCC1 may be used in the normal mode. The second power supply voltage VCC2 may be used to test a connection state of a fuse included in each of the fuse units 130. For example, after a cutting operation is performed on the fuse, a second power supply voltage VCC2 having a higher voltage level than the first power supply voltage VCC1 output to the first node N1 during the normal mode may be transmitted to the first node N1, and the connection state of the fuse may be tested. When the cutting operation is not performed on the fuse, a second power supply voltage VCC2 having a lower voltage level than the first power supply voltage VCC1 output to the first node in the normal mode may be transmitted to the first node N1, and the connection state of the fuse may be tested. That is, e.g., the second power supply voltage VCC2 may be controlled to have a higher voltage level than the first power supply voltage VCC1 and/or a lower voltage level than the first power supply voltage VCC1.

Figure 5:
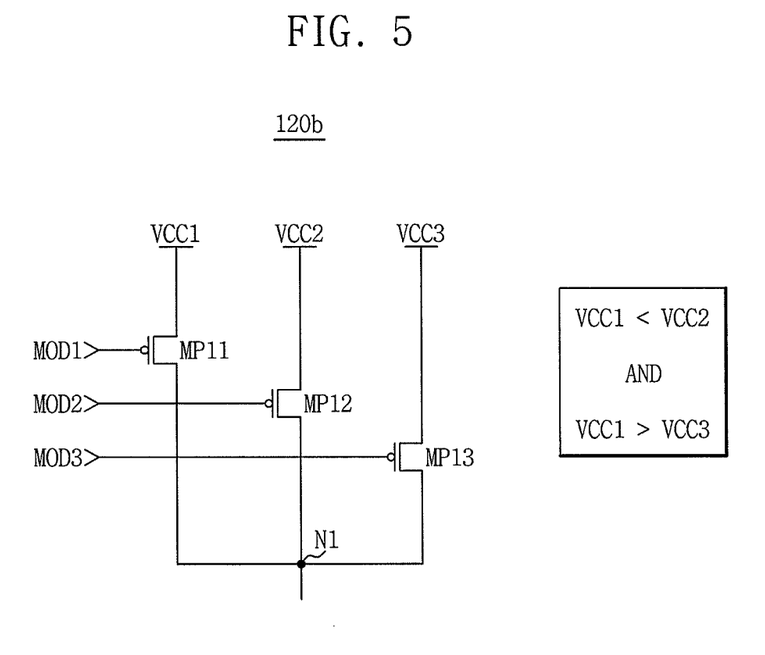
FIG. 5 illustrates a circuit diagram of an exemplary embodiment of a power supply voltage selection circuit employable in the fuse circuit of FIG. 1.

FIG. 5 illustrates a circuit diagram of an exemplary embodiment of a power supply voltage selection circuit 120b employable in the fuse circuit of FIG. 1.

Referring to FIG. 5, the power supply voltage selection circuit 120b may include a first PMOS transistor MP11, a second PMOS transistor MP12, and a third PMOS transistor MP13.

The first PMOS transistor MP11 may output a first power supply voltage VCC1 to a first node N1 in response to a first mode signal MOD1. The second PMOS transistor MP12 may output a second power supply voltage VCC2 having a higher voltage level than the first power supply voltage VCC1 to the first node N1 in response to a second mode signal MOD2. The third PMOS transistor MP13 may output a third power supply voltage VCC3 having a lower voltage level than the first power supply voltage VCC1 to the first node N1 in response to a third mode signal MOD3.

Referring to FIG. 5, the first power supply voltage VCC1 may be used in a normal mode. The second power supply voltage VCC2 may be used to test a connection state of the fuse after a cutting operation is performed on the fuse included in each of the fuse units 130. The third power supply voltage VCC3 may be used to test the connection state of the fuse when a cutting operation is not performed on the fuse.

Figure 6:
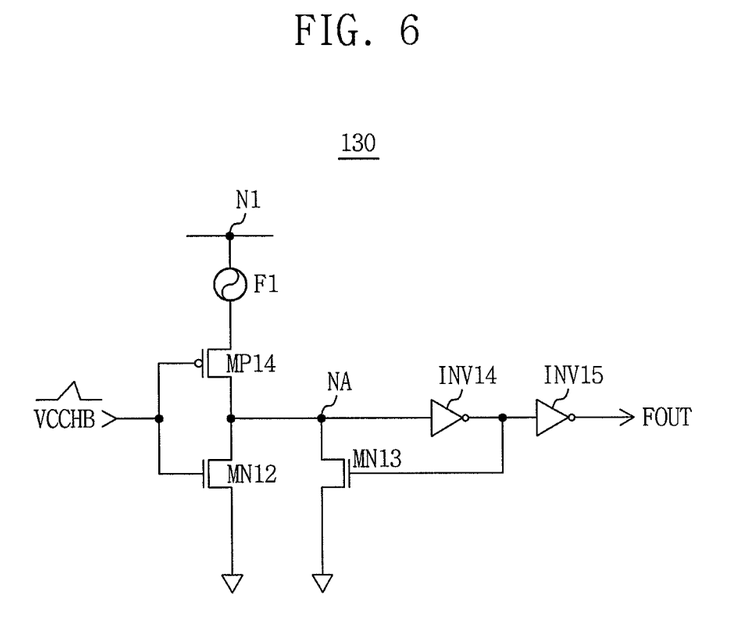
FIG. 6 illustrates a circuit diagram of an exemplary embodiment of a fuse unit employable in the fuse circuit of FIG. 1.

FIG. 6 illustrates a circuit diagram of an exemplary embodiment of the fuse unit 130 employable in the fuse circuit of FIG. 1.

Referring to FIG. 6, the fuse unit 130 may include a fuse F1, a fourth PMOS transistor MP14, a second NMOS transistor MN12, a fourth inverter INV14, a third NMOS transistor MN13, and a fifth inverter INV15.

The fuse F1 may include a first terminal connected to the first node N1. The fourth PMOS transistor MP14 may include a gate to which a power-up signal VCCHB is applied, a source connected to a second terminal of the fuse F1, and a drain connected to a second node NA. The second NMOS transistor MN12 may include a gate to which the power-up signal VCCHB is applied, a drain connected to the second node NA, and a source connected to a ground. The fourth inverter INV14 may invert a phase of a voltage signal of the second node NA. The third NMOS transistor MN13 may include a drain connected to the second node NA, a gate connected to an output terminal of the fourth inverter INV14, and a source connected to the ground. The fifth inverter INV15 may invert a phase of an output signal of the fourth inverter INV14 and may generate a fuse output signal FOUT.

As described above, the power-up signal VCCHB may be maintained at a logic high level for a predetermined short time after application of a power supply voltage VCC. The power-up signal VCCHB may be maintained at a logic low level after stabilization of the power supply voltage VCC. After a cutting operation is performed on the fuse F1, the second node NA may reach a logic low level so that the fuse output signal FOUT may reach a logic low level. When a cutting operation is not performed on the fuse F1, a voltage of the first node N1 corresponding to a power supply voltage, e.g., the first power supply voltage VCC1, the second power supply voltage VCC2, may be applied to the second node NA, and the second node NA may reach a logic high level so that the fuse output signal FOUT may reach a logic high level.

In embodiments, referring to FIG. 1, the fuse circuit 100 may transmit different power supply voltages in the normal mode and the test mode to allow the fuse unit 130 to perform a logic operation.

The fuse circuit 100 may output the first power supply voltage VCC1 to the first node N1 in the normal mode.

More particularly, referring to FIGS. 4 and 6, in some embodiments the power supply voltage selection circuit 120a may output the first power supply voltage VCC1 and the second power supply voltage VCC2. After a cutting operation is performed on the fuse F1, the fuse circuit 100 may transmit the second power supply voltage VCC2 having a higher voltage level than the first power supply voltage VCC1 to the first node N1. The fuse circuit 100 may detect a logic state of a voltage signal of the second node NA, and/or may test a connection state of the fuse F1. In such embodiments, after a cutting operation is performed on the fuse F1, when the voltage signal of the second node NA is at a logic high level, it may be determined that the fuse F1 has a failed connection state.

More particularly, in embodiments, after a cutting operation is performed on the fuse F1, the second power supply voltage VCC2 having a higher voltage level than the first power supply voltage VCC1 may be used for a logic operation of the fuse units 130 in the test mode. In such embodiments, even if the connection state of the fuse F1 is slightly maintained due to residue remaining in the fuse F1, a semiconductor device including the fuse circuit 100 may be processed as a failed device. Thus, when residue remains in the fuse F1 despite the cutting of the fuse F1, the semiconductor device including the fuse circuit 100 may be prevented from being recognized as a good device and put on the market.

In embodiments, when a cutting operation is performed on the fuse F1, a second power supply voltage VCC2 of FIG. 4 or a third power supply voltage VCC3 of FIG. 5, which may have a lower voltage level than a first power supply voltage VCC1, may be transmitted to the first node N1, and a logic level of a voltage signal of the second node NA may be detected to test a connection state of the fuse F1. When the cutting operation is performed on the fuse F1, the voltage signal of the second node NA may be at a low logic level. In this case, it may be determined that the fuse F1 has a failed connection state, i.e., is not connected.

When the cutting operation is not performed on the fuse F1, referring, e.g., to FIGS. 5 and 6, in some embodiments, the second power supply voltage VCC2 or third power supply voltage VCC3 having a lower voltage level than the first power supply voltage VCC1 may be used for a logic operation of the fuse units 130 in the test mode. In some cases, a defect may exist in the fuse F1. For example, the fuse F1 may have a smaller thickness than a normal fuse. When a defect exists in the fuse F1, the fuse F1 may have, e.g., a poor connection state so that a semiconductor device including the fuse circuit 100 may be processed as a failed device. More particularly, e.g., depending on a voltage signal of the second node NA, and a voltage level of the power supply voltage, e.g., VCC2, VCC3, supplied to the fuse unit 130, a connection state of the fuse F1 may be determined. When the fuse F1 is defective, the semiconductor device including the fuse circuit 100 may be prevented from being recognized as a good device and put on the market.

Figure 7:
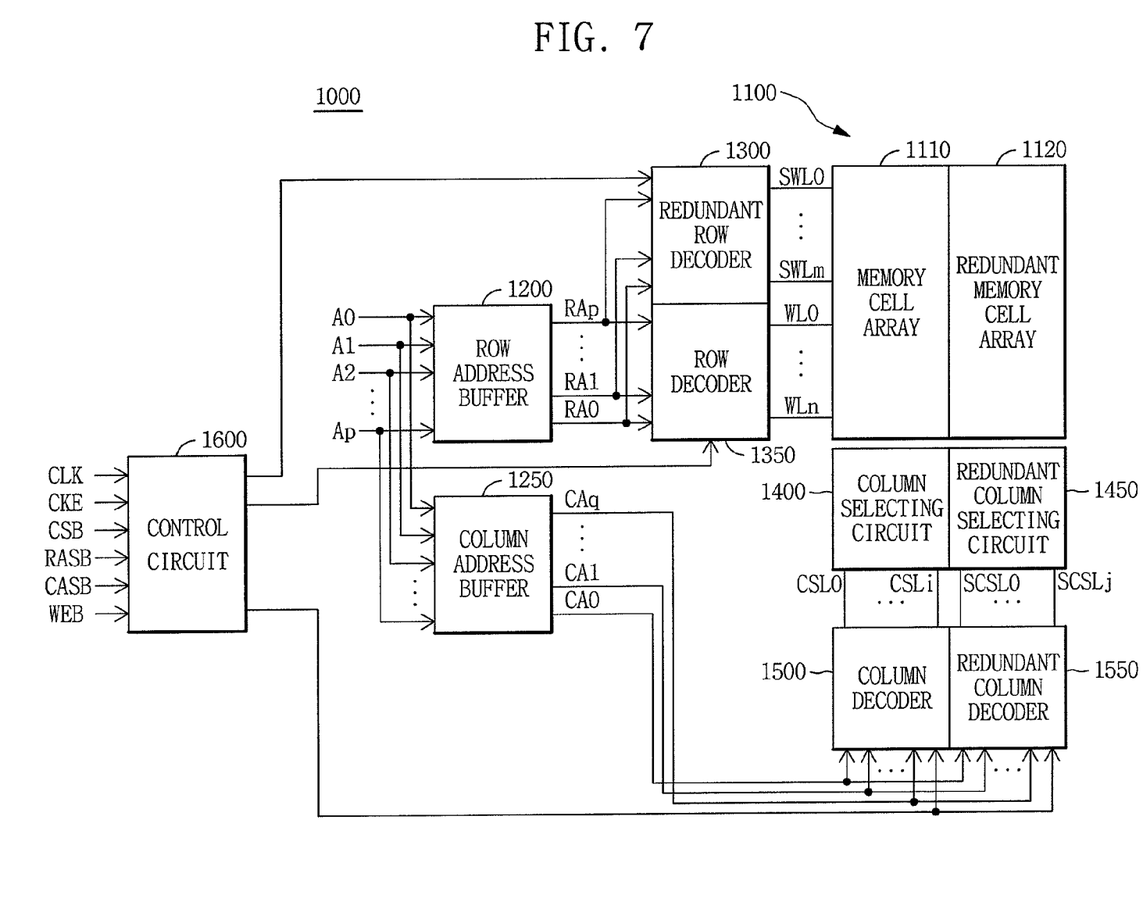
FIG. 7 illustrates a block diagram of an exemplary embodiment of a semiconductor memory device employing the fuse circuit of FIG. 1.

FIG. 7 illustrates a block diagram of an exemplary embodiment of a semiconductor memory device 1000 employing the fuse circuit of FIG. 1.

Referring to FIG. 7, the semiconductor memory device 1000 may include a memory cell array 1100, a row address buffer 1200, a column address buffer 1250, a row decoder 1350, a redundant row decoder 1300, a column decoder 1500, a redundant column decoder 1550, a column selection circuit 1400, and a redundant column selection circuit 1450. Also, the semiconductor memory device 1000 may include a control circuit 1600 configured to generate control signals and control blocks of the semiconductor memory device 1000 based on command signals, such as a clock signal CLK, a clock enable signal CKE, a chip selection signal CSB, a row address strobe signal RASB, a column address strobe signal CASB, and a write enable signal WEB.

The memory cell array 1100 may include a normal memory cell array 1110 and a redundant memory cell array 1120. The normal memory cell array 1110 may be connected to word lines and column selection lines. The redundant memory cell array 1120 may be connected to redundant word lines and redundant column selection lines. The row address buffer 1200 may buffer address signals A0, A1, . . . , and Ap. The row address buffer 1200 may generate row address signals RA0, RA1, . . . , and RAp. The column address buffer 1250 may buffer the address signals A0, A1, . . . , and Ap. The column address buffer 1250 may generate column address signals CA0, CA1, . . . , and CAq.

The row decoder 1350 may decode the row address signals RA0, RA1, . . . , and Rap. The row decoder 1350 may generate word line driving signals WL0, and WLn, and may transmit the word line driving signals WL0, . . . , and WLn to the word lines. When a defect occurs in at least one of the word lines, the redundant row decoder 1300 may decode the row address signals RA0, RA1, . . . , and Rap, and may generate redundant word line driving signals SWL0, . . . , and SWLm. The redundant row decoder 1300 may transmit the redundant word line driving signals SWL0, . . . , and SWLm to the redundant word lines.

The column decoder 1500 may decode the column address signals CA0, CA1, . . . , and CAq. The column decoder 1500 may generate column selection signals CSL0, . . . , and CSLi, and may transmit the column selection signals CSL0, . . . , and CSLi to the column selection lines. When a defect occurs in at least one of the column selection lines, the redundant column decoder 1550 may decode the column address signals CA0, CA1, . . . , and CAq, and may generate redundant column selection signals SCSL0, . . . , and SCSLj. The redundant column decoder 1550 may transmit the redundant column selection signals SCSL0, . . . , and SCSLj to the redundant column selection lines.

The column selection circuit 1400 may amplify the column selection signals CSL0, . . . , and CSLi. The column selection circuit 1400 may control the input and output of data to and from the normal memory cell array 1110. The redundant column selection circuit 1450 may amplify the redundant column selection signals SCSL0, . . . , and SCSLj. The redundant column selection circuit 1450 may control the input and output of data to and from the redundant memory cell array 1120.

The redundant row decoder 1300 and/or the redundant column decoder 1550 of the semiconductor memory device 1000 of FIG. 7 may include a fuse circuit employing one or more features described herein, e.g., the fuse circuit 100 of FIG. 1. Thus, the redundant row decoder 1300 and/or the redundant column decoder 1550 of the semiconductor memory device 1000 may select one of a plurality of power supply voltages, e.g., VCC1, VCC2, VCC3, according to an operation mode, use the selected power supply voltage as a power supply voltage for a logic operation, and may perform a fusing operation to generate a fuse output voltage. Thus, the semiconductor memory device 1000 may selectively use a power supply voltage according to the operation mode and may exactly determine a cut state of a fuse and whether the fuse is defective or not.

Although FIG. 7 illustrates the semiconductor memory device 1000 including both the redundant row decoder 1300 and the redundant column decoder 1550, embodiments are not limited thereto. For example, embodiments of a semiconductor memory device may include only one of the redundant row decoder 1300 and the redundant column decoder 1550.

Figure 8:
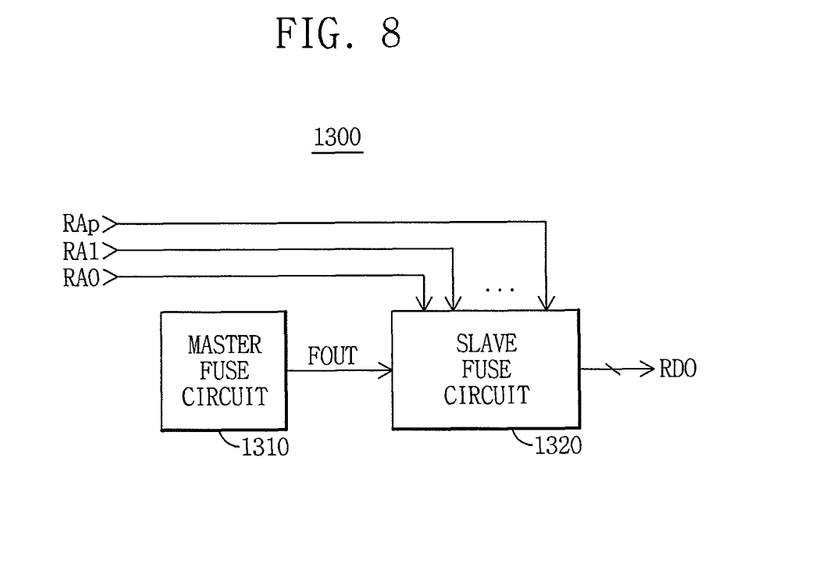
FIG. 8 illustrates a block diagram of an exemplary embodiment of the redundant row decoder of FIG. 7.

FIG. 8 illustrates a block diagram of an exemplary embodiment of the redundant row decoder 1300 of FIG. 7.

The redundant row decoder 1300 may include a master fuse circuit 1310 and a slave fuse circuit 1320.

The master fuse circuit 1310 may employ one or more features described herein. For example, the master fuse circuit 1310 may have the same configuration as the fuse circuit of FIG. 1. The master fuse circuit 1310 may selectively use a power supply voltage according to an operation mode and generate a fuse output signal FOUT. The slave fuse circuit 1320 may operate in response to the fuse output signal FOUT and may generate a redundant row output signal RDO based on row address signals RA0, RA1, . . . , and RAp. The redundant row output signal RDO may correspond to the redundant word line driving signals SWL0, . . . , and SWLm of FIG. 7.

Figure 9:
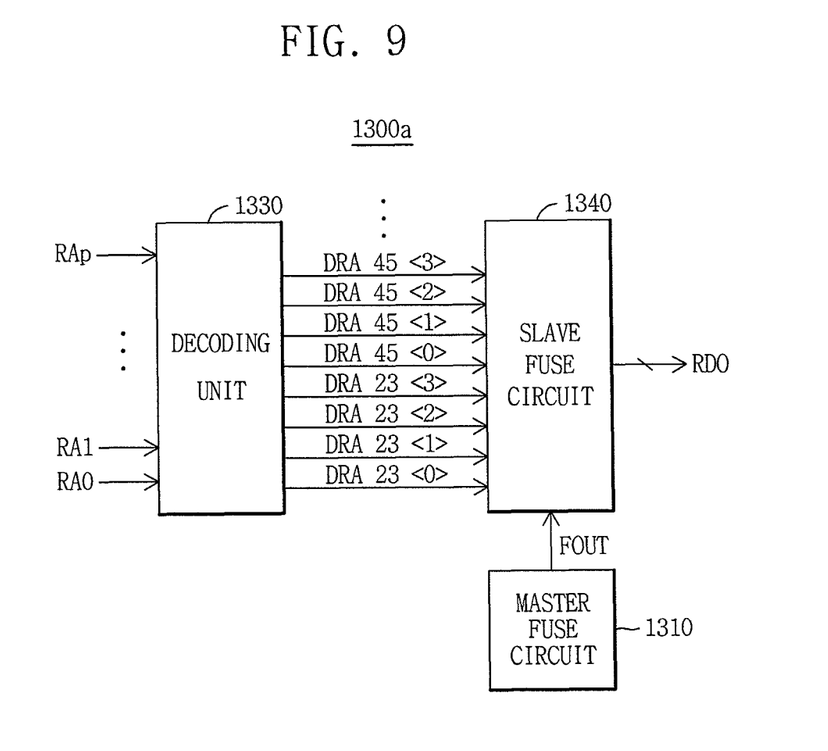
FIG. 9 illustrates a block diagram of another exemplary embodiment of the redundant row decoder of FIG. 7.

FIG. 9 illustrates a block diagram of another exemplary embodiment of the redundant row decoder 1300a of FIG. 7.

Referring to FIG. 9, the redundant row decoder 1300a may include a decoding unit 1330, the master fuse circuit 1310, and the slave fuse circuit 1340.

The decoding unit 1330 may decode row address signals RA0, RA1, . . . , and Rap and generate the decoded row address signals DRA23<0>, DRA23<1>, and . . . . The master fuse circuit 1310 may have the same configuration as the fuse circuit 100 of FIG. 1, according to embodiments of the inventive concept, and selectively use a power supply voltage according to an operation mode to generate a fuse output signal FOUT. The slave fuse circuit 1340 may operate in response to the fuse output signal FOUT and generate a redundant row output signal RDO based on the decoded row address signals DRA23<0>, DRA23<1>, . . . . The redundant row output signal RDO may correspond to the redundant word line driving signals SWL0, . . . , and SWLm of FIG. 7.

Figure 10:
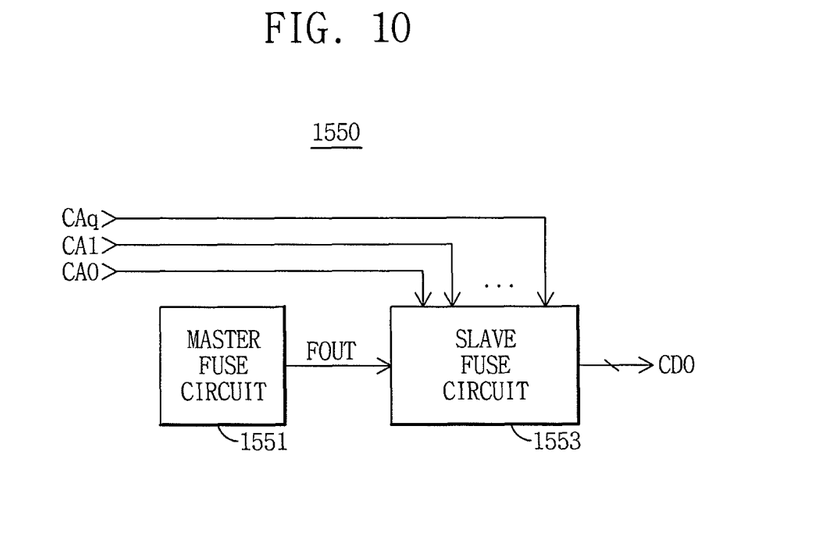
FIG. 10 illustrates a block diagram of the exemplary embodiment of the redundant column decoder of FIG. 7.

FIG. 10 illustrates a block diagram of the exemplary embodiment of the redundant column decoder 1550 of FIG. 7.

Referring to FIG. 10, the redundant column decoder 1550 may include a master fuse circuit 1551 and a slave fuse circuit 1553.

The master fuse circuit 1551 may have the same configuration as the fuse circuit 100 of FIG. 1, according to embodiments of the inventive concept, and selectively use a power supply voltage according to an operation mode to generate a fuse output signal FOUT. The slave fuse circuit 1553 may operate in response to the fuse output signal FOUT and generate a redundant column output signal CDO based on column address signals CA0, CA1, . . . , and CAq. The redundant column output signal CDO may be redundant column selection signals SCSL0, . . . , and SCSLj of FIG. 7.

Figure 11:
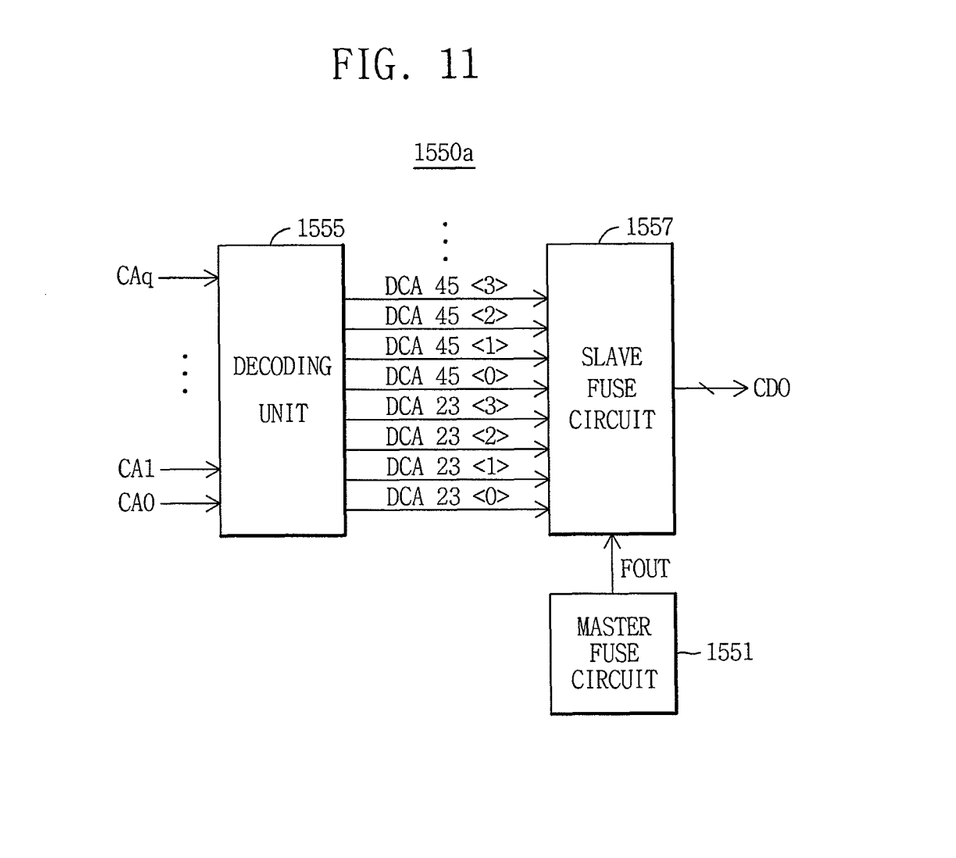
FIG. 11 illustrates a block diagram of another exemplary embodiment of a redundant column decoder of FIG. 7.

FIG. 11 illustrates a block diagram of another exemplary embodiment of the redundant column decoder 1550a of FIG. 7.

Referring to FIG. 11, the redundant row decoder 1550a may include a decoding unit 1555, a master fuse circuit 1551, and a slave fuse circuit 1557.

The decoding unit 1555 may decode column address signals CA0, CA1, . . . , and CAq and may generate the decoded column address signals DCA23<0>, DCA23<1>, etc. The master fuse circuit 1551 may have the same configuration as the fuse circuit 100 of FIG. 1. The master fuse circuit 1551 may selectively use a power supply voltage according to an operation mode to generate a fuse output signal FOUT. The slave fuse circuit 1557 may operate in response to the fuse output signal 1557 and may generate a redundant column output signal CDO based on the decoded column address signals DCA23<0>, DCA23<1>, etc. The redundant column output signal CDO may correspond to the redundant column selection signals SCSL0, . . . , and SCSLj of FIG. 7.

Figure 12:
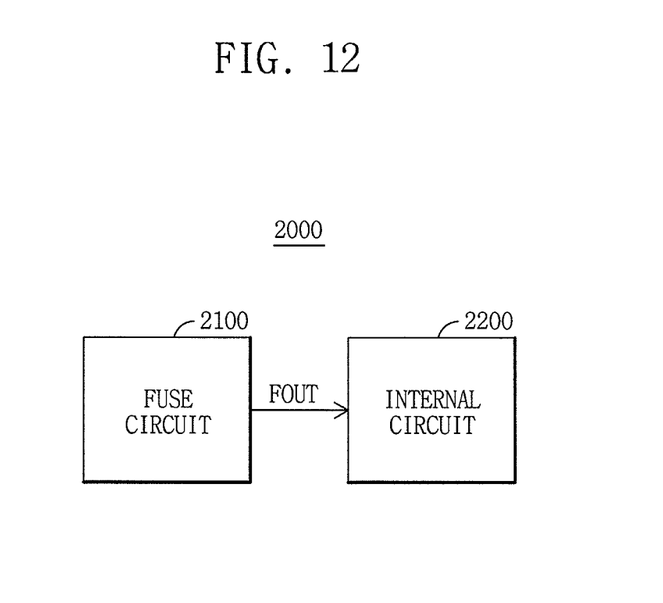
FIG. 12 illustrates a block diagram of an exemplary semiconductor device employing the fuse circuit of FIG. 1.

FIG. 12 illustrates a block diagram of an exemplary semiconductor device 2000 employing the fuse circuit 100 of FIG. 1.

Referring to FIG. 12, the semiconductor device 2000 may include a fuse circuit 2100 and an internal circuit 2200.

The fuse circuit 2100 may select one out of a plurality of power supply voltages according to an operation mode. The fuse circuit 2100 may use the selected power supply voltage as a power supply voltage for a logic operation, and may perform a fusing operation to generate a fuse output voltage FOUT. The internal circuit 2200 may perform a specific operation in response to the fuse output voltage FOUT. The specific operation may include selecting the operation mode of the semiconductor device 2000 and/or enabling a redundancy array when a defective cell is included in a memory cell array.

Figure 13:
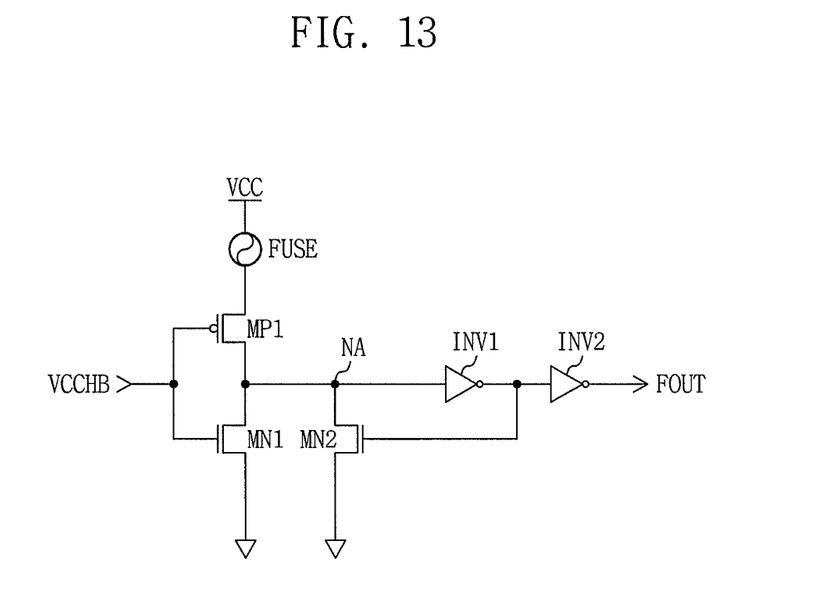
FIG. 13 illustrates a circuit diagram of a fuse circuit.

Referring to FIG. 13, a case of a fuse circuit that receives a power supply voltage VCC and has a logic circuit with logic gates configured to generate output voltage signals FOUT having different logic levels is shown.

Referring to FIG. 13, in such cases, when a cutting operation is not performed on a fuse FUSE, an inverter including a PMOS transistor MP1 and an NMOS transistor MN1 may output a high-level voltage signal to a node NA in response to a power-up signal VCCHB. The power-up signal VCCHB may be maintained at a logic high level for a short time after application of a power supply voltage VCC, and may be maintained at a logic low level after stabilization of the power supply voltage VCC. Thus, when the cutting operation is not performed on the fuse, a voltage of the node NA may be maintained at a logic low level in an initial operation of the fuse circuit, and may rise to a logic high level after the stabilization of the power supply voltage VCC.

When the cutting operation is performed on the fuse, since the power supply voltage VCC is not electrically connected to a source terminal of the PMOS transistor MP1, the node NA may be maintained at a logic low level.

However, in cases such as that shown in FIG. 13, even if the cutting operation is performed on the fuse FUSE, the fuse FUSE may not be completely cut but slightly connected. Thus, the voltage of the node NA may be at a slightly higher voltage level than an absolute logic low level, so that a semiconductor device including the fuse circuit may not be processed as a failed device but rather may be recognized as a good device during a test process, and then put on the market. Conversely, if the cutting operation is not performed on the fuse FUSE, the voltage of the node NA may be at a voltage level lower than an absolute logic high level and higher than an absolute logic low level so that the semiconductor device including the fuse circuit cannot be processed as a failed device.

Features of embodiments described herein with regard to FIGS. 1-12 may be applied to a semiconductor device, e.g., a semiconductor device including a fuse circuit. Embodiments of a fuse circuit may select one out of a plurality of power supply voltages according to an operation mode and may perform a logic operation. Even if the connection state of a fuse, e.g., F1, is slightly maintained due to residue remaining in the fuse F1 despite the fuse F1 being cut, a semiconductor device including the fuse circuit may be processed as a failed device. Thus, when the residue remains in a fuse, e.g., F1, despite the fuse F1 being cut, the semiconductor device including embodiments of a fuse circuit employing one or more features described herein may be prevented from being recognized as a good device and put on the market.

Embodiments may provide a fuse circuit such that when a cutting operation is not performed on a fuse, e.g., F1, the fuse F1 may have a poor connection state due to occurrence of a defect in the fuse F1. In embodiments, the semiconductor device including the fuse circuit, e.g., 100, may be processed as a failed device. Thus, when the fuse F1 is defective, the semiconductor device including the fuse circuit may be prevented from being recognized as a good device and put on the market.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A fuse circuit, comprising:
   a mode generating circuit configured to generate a plurality of mode signals based on a power-up signal and a test mode-register-set (TMRS) signal;
   a power supply voltage selection circuit configured to select one of a plurality of power supply voltages in response to the plurality of mode signals and output the selected power supply voltage to a first node; and
   at least one fuse unit coupled between the first node and a ground voltage and configured to use the selected power supply voltage as a power supply voltage for a logic operation, and perform a fusing operation to generate a fuse output voltage.

2. The fuse circuit as claimed in claim 1, wherein the fuse circuit is configured to operate in a normal mode when the power-up signal is disabled and the TMRS signal is disabled, and operate in a test mode when the power-up signal is disabled and the TMRS signal is enabled.

3. The fuse circuit as claimed in claim 1, wherein a first power supply voltage is output to the first node in a normal mode, and a second power supply voltage having a different voltage level from the first power supply voltage is output to the first node in a test mode.

4. The fuse circuit as claimed in claim 1, wherein the mode generating circuit comprises:
   a first inverter configured to invert a phase of a test mode-register-set (TMRS) signal;
   a NOR gate configured to perform a logic NOR on a power-up signal and an output signal of the first inverter;
   a second inverter configured to invert a phase of an output signal of the NOR gate;
   a MOS transistor having a drain connected to an input terminal of the second inverter, a gate connected to an output terminal of the second inverter, and a source connected to a ground; and
   a third inverter configured to invert a phase of an output signal of the second inverter.

5. The fuse circuit as claimed in claim 4, wherein a first mode signal is output from the output terminal of the second inverter, and a second mode signal is output from an output terminal of the third inverter.

6. The fuse circuit as claimed in claim 1, wherein a first mode signal is enabled and a second mode signal is disabled in a normal mode, and the first mode signal is disabled and the second mode signal is enabled in a test mode.

7. The fuse circuit as claimed in claim 1, wherein the power supply voltage selection circuit comprises:
   a first MOS transistor configured to output a first power supply voltage to the first node in response to a first mode signal; and
   a second MOS transistor configured to output a second power supply voltage having a different voltage level from the first power supply voltage to the first node in response to a second mode signal.

8. The fuse circuit as claimed in claim 7, wherein the first power supply voltage is used in a normal mode, and the second power supply voltage is used to test a connection state of a fuse included in each of the fuse units.

9. The fuse circuit as claimed in claim 1, wherein the power supply voltage selection circuit comprises:
   a first MOS transistor configured to output a first power supply voltage to the first node in response to a first mode signal;

a second MOS transistor configured to output a second power supply voltage having a higher voltage level than the first power supply voltage to the first node in response to a second mode signal; and a third MOS transistor configured to output a third power supply voltage having a lower voltage level than the first power supply voltage to the first node in response to a third mode signal.

10. The fuse circuit as claimed in claim 9, wherein the first power supply voltage is used in a normal mode, the second power supply voltage is used to test a connection state of a fuse included in each of the fuse units after a cutting operation is performed on the fuse, and the third power supply voltage is used to test the connection state of the fuse when the cutting operation is not performed on the fuse.

11. The fuse circuit as claimed in claim 1, wherein each of the fuse units comprises:

a fuse including a first terminal connected to the first node;

a first PMOS transistor including a gate to which a power-up signal is applied, a source connected to a second terminal of the fuse, and a drain connected to a second node;

a first NMOS transistor including a gate to which the power-up signal is applied, a drain connected to the second node, and a source connected to a ground;

a first inverter configured to invert a phase of a voltage signal of the second node;

a second NMOS transistor including a drain connected to the second node, a gate connected to an output terminal of the first inverter, and a source connected to the ground; and a second inverter configured to invert a phase of an output signal of the first inverter and generate a fuse output signal.

12. The fuse circuit as claimed in claim 11, wherein after a cutting operation is performed on the fuse, a second power supply voltage having a voltage level higher than a first power supply voltage output to the first node in the normal mode is transmitted to the first node, and a logic state of the voltage signal of the second node is detected to test a connection state of the fuse.

13. The fuse circuit as claimed in claim 12, wherein when the voltage signal of the second node is at a logic high level, a connection state of the fuse is determined to be failed.

14. The fuse circuit as claimed in claim 11, wherein when a cutting operation is not performed on the fuse, a second power supply voltage having a voltage level lower than the first power supply voltage output to the first node in the normal mode is transmitted to the first node, and the logic state of the voltage signal of the second node is detected to test the connection state of the fuse.

15. The fuse circuit as claimed in claim 14, wherein when the voltage signal of the second node is at a logic low level, a connection state of the fuse is determined to be failed.

16. A semiconductor memory device, comprising:

a memory cell array having a normal memory cell array connected to word lines and column selection lines and a redundant memory cell array connected to redundant word lines and redundant column selection lines;

a row decoder configured to decode row address signals, generate word line driving signals, and transmit the word line driving signals to the word lines; and a redundant row decoder configured to decode the row address signals, generate redundant word line driving signals, and transmit the redundant word line driving signals to the redundant word lines when a defect occurs in at least one of the word lines, wherein the redundant row decoder includes a fuse circuit configured to select one of a plurality of power supply voltages according to an operation mode, use the selected power supply voltage as a power supply voltage for a logic operation, and perform a fusing operation to generate a fuse output voltage.

17. A semiconductor memory device, comprising:

a memory cell array including a normal memory cell array connected to word lines and column selection lines and a redundant memory cell array connected to redundant word lines and redundant column selection lines;

a column decoder configured to decode column address signals, generate column selection signals, and transmit the column selection signals to the column selection lines; and a redundant column decoder configured to decode the column address signals, generate redundant column selection signals, and transmit the redundant column selection signals to the redundant column selection lines when a defect occurs in at least one of the column selection lines, wherein the redundant column decoder includes a fuse circuit configured to select one of a plurality of power supply voltages according to an operation mode, use the selected power supply voltage as a power supply voltage for a logic operation, and perform a fusing operation to generate a fuse output voltage.

18. A semiconductor device, comprising:

a fuse circuit configured to select one of a plurality of power supply voltages according to an operation mode, use the selected power supply voltage as a power supply voltage for a logic operation, and perform a fusing operation to generate a fuse output voltage; and an internal circuit configured to perform a specific operation in response to the fuse output voltage, wherein the plurality of voltages are selected based on a power-up signal and a test mode-register-set (TMRS) signal.

19. The semiconductor device as claimed in claim 18, wherein the specific operation includes selecting the operation mode of the semiconductor device or enabling a redundancy array when a defective cell is included in a memory cell array.

* * * * *